(12) United States Patent
Wang (10) Patent No.: US 10,971,405 B2
(45) Date of Patent: Apr. 6, 2021

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 36 days.

(21) Appl. No.: 16/419,416

(22) Filed: May 22, 2019

(65) Prior Publication Data

US 2019/0371679 A1 Dec. 5, 2019

(30) Foreign Application Priority Data

May 31, 2018 (CN) .......................... 201810551963.9

(51) Int. Cl.
| | |
|---|---|
| *H01L 21/8238* | (2006.01) |
| *H01L 21/28* | (2006.01) |
| *H01L 21/266* | (2006.01) |
| *H01L 27/092* | (2006.01) |
| *H01L 29/49* | (2006.01) |
| *H01L 29/66* | (2006.01) |

(Continued)

(52) U.S. Cl.
CPC ........... *H01L 21/823821* (2013.01); *H01L 21/0337* (2013.01); *H01L 21/266* (2013.01); *H01L 21/28088* (2013.01); *H01L 21/823842* (2013.01); *H01L 27/0924* (2013.01); *H01L 29/4966* (2013.01); *H01L 29/66545* (2013.01); *H01L 29/66795* (2013.01); *H01L 29/7851* (2013.01)

(58) Field of Classification Search
CPC ......... H01L 21/823821; H01L 21/0337; H01L 21/266; H01L 21/28088; H01L 21/823842; H01L 27/0924; H01L 29/4966
See application file for complete search history.

(56) References Cited

U.S. PATENT DOCUMENTS

9,679,819 B1* 6/2017 Tung .................... H01L 27/0921
10,121,875 B1* 11/2018 Ho ........................ H01L 27/0922
(Continued)

*Primary Examiner* — Nathan W Ha
(74) *Attorney, Agent, or Firm* — Anova Law Group, PLLC (57) ABSTRACT

A method for fabricating a semiconductor device includes providing a base substrate, including a first region and a second region. The first region is located on each side of the second region, and a plurality of fin structures is formed in the first region and the second region. The method includes forming a first doped region and a second doped region in the first region and the second region, respectively in the plurality of fin structures. The concentration of doping ions in the first doped region is lower than that in the second doped region, and the doping ions in the first doped region and the second doped region are the same doping type. After forming the first doped region and the second doped region, the method includes forming a plurality of gate structures on the first doped region and the second doped region across the plurality of fin structures.

20 Claims, 6 Drawing Sheets

(51) Int. Cl.
   *H01L 29/78*      (2006.01)
   *H01L 21/033*     (2006.01)

(56) References Cited

U.S. PATENT DOCUMENTS

| | | | |
|---|---|---|---|
| 10,170,555 B1* | 1/2019 | Liao | H01L 21/823821 |
| 10,170,577 B1* | 1/2019 | Lee | H01L 21/823431 |
| 10,205,005 B1* | 2/2019 | Liou | H01L 21/2255 |
| 2016/0043225 A1* | 2/2016 | Ching | H01L 21/02532 |
| | | | 257/401 |
| 2016/0372379 A1* | 12/2016 | Cheng | H01L 21/02647 |
| 2017/0069539 A1* | 3/2017 | Li | H01L 27/0886 |
| 2017/0221889 A1* | 8/2017 | Dasgupta | H01L 21/823431 |
| 2017/0221890 A1* | 8/2017 | Wang | H01L 21/823418 |
| 2018/0053824 A1* | 2/2018 | Wang | H01L 21/76224 |
| 2018/0175046 A1* | 6/2018 | Chiou | H01L 29/41791 |
| 2019/0067126 A1* | 2/2019 | Chen | H01L 21/02532 |
| 2019/0172830 A1* | 6/2019 | Ok | H01L 29/66666 |
| 2019/0198398 A1* | 6/2019 | De Silva | H01L 21/266 |
| 2019/0288069 A1* | 9/2019 | Liaw | H01L 29/41791 |
| 2019/0304840 A1* | 10/2019 | Lee | H01L 21/845 |
| 2020/0006159 A1* | 1/2020 | Shih | H01L 29/0847 |

* cited by examiner

SEMICONDUCTOR DEVICES AND FABRICATION METHODS THEREOF

CROSS-REFERENCES TO RELATED APPLICATIONS

This application claims the priority of Chinese Patent Application No. CN201810551963.9, filed on May 31, 2018, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

With the rapid development of semiconductor manufacturing technology, semiconductor devices are moving toward having higher component densities and higher integration levels. As the most basic semiconductor device, field-effect transistor (FET) has been widely used. For the traditional planar FET, as the feature size of the FET continuously becomes smaller, the ability to control the channel current is weakened, resulting in the short channel effect (SCE) and a leakage current. As such, the electrical performance of the semiconductor device may be ultimately degraded.

In order to overcome the SCE and suppress the leakage current, a fin field-effect transistor (Fin-FET) has been introduced according to the exiting technology. The Fin-FET is a common multi-gate device. The structure of a Fin-FET includes a fin structure and an insulation layer disposed on the surface of a semiconductor substrate. The insulation layer covers a portion of the sidewall surfaces of the fin structure. The fin-FET also includes a gate structure formed on the insulation layer and covering a portion of the top and sidewall surfaces of the fin structure, and a source region and a drain region formed in the fin structure on the two opposite sides of the gate structure.

However, the performance of Fin-FETs formed by methods according to the existing technology may still need to be improved. The disclosed semiconductor devices and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a base substrate, including a first region and a second region. The first region is adjacent to the second region and located on each side of the second region. A plurality of discrete fin structures is formed on the base substrate, and includes a first plurality of fins structures in the first region and a second plurality of fin structures in the second region. The method also includes forming a first doped region in the first plurality of fin structures in the first region; and forming a second doped region in the second plurality of fin structures in the second region. The concentration of doping ions in the first doped region is lower than the concentration of doping ions in the second doped region, and the doping ions in the first doped region and the second doped region have a same doping type. The method further includes after forming the first doped region and the second doped region, forming a plurality of gate structures on the first doped region and the second doped region across the plurality of discrete fin structures.

Another aspect of the present disclosure provides another method for fabricating a semiconductor device. The method includes providing a base substrate, including a first region and a second region. The first region is adjacent to the second region and located on each side of the second region. A plurality of discrete fin structures is formed on the base substrate in the first region and the second region, and the plurality of discrete fin structures includes a first plurality of fins structures in the first region and a second plurality of fin structures in the second region. The method also includes forming a dielectric layer on the base substrate. The dielectric layer contains a plurality of openings exposing a portion of a surface of each fin structure of the plurality of discrete fin structures, and the plurality of openings includes a first plurality of openings in the first region and a second plurality of openings in the second region. The method further includes forming a gate dielectric layer on bottom surfaces of the plurality of openings; forming a first work-function adjustment layer on a surface of the gate dielectric layer in the first plurality of openings in the first region; and forming a second work-function adjustment layer on the surface of the gate dielectric layer in the second plurality of openings in the second region before or after forming the first work-function adjustment layer. The work function value of the second work-function adjustment layer is different from the work function value of the first work-function adjustment layer; the first work-function adjustment layer and the second work-function adjustment layer have a same work function type. After forming the first work-function adjustment layer and the second work-function adjustment layer, the method also includes forming a gate electrode layer in the plurality of openings. The gate electrode layer fills up the plurality of openings.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
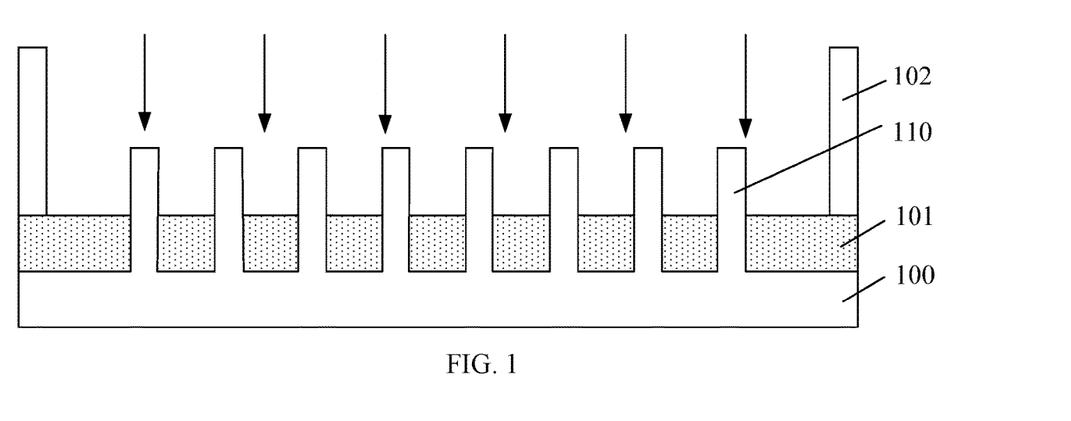
FIGS. 1-2 illustrate schematic views of structures at various stages in a process for fabricating a semiconductor device.
Figure 2:
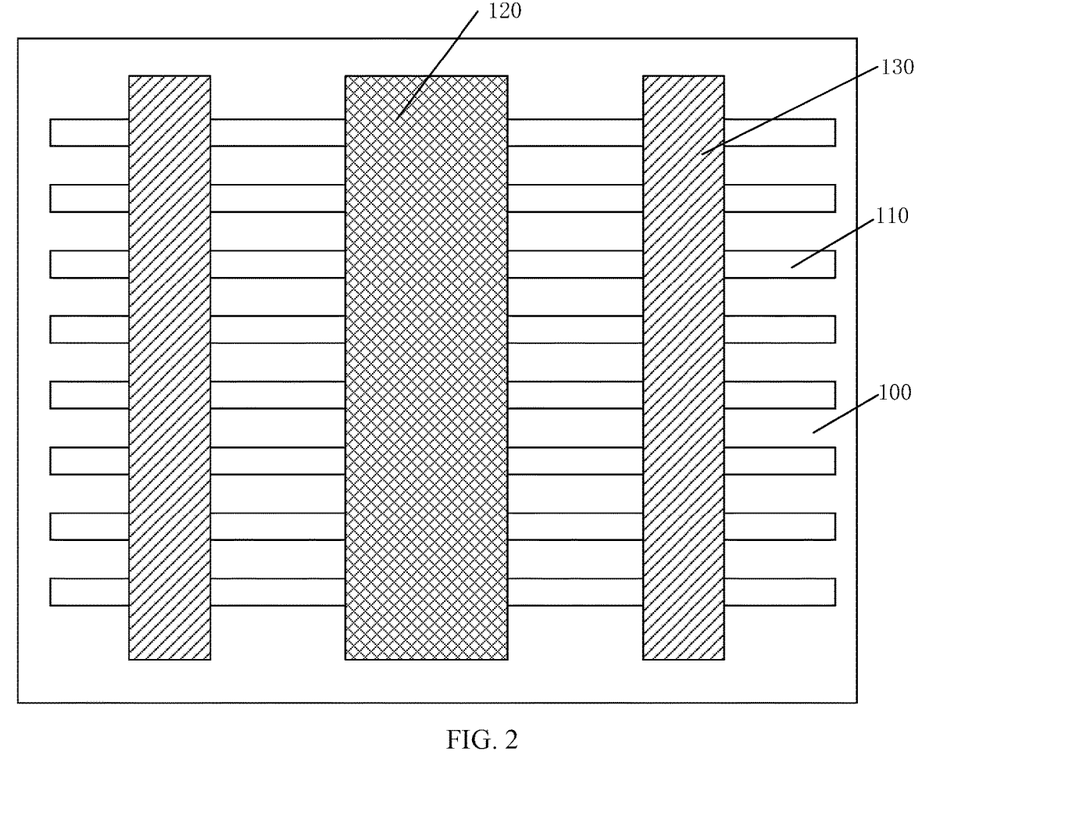

FIGS. 1-2 illustrate schematic views of structures at various stages in a process for fabricating a semiconductor device.

FIG. 1 illustrates a partial cross-sectional view of a semiconductor structure during an ion implantation process. Referring to FIG. 1, according to a process for fabricating a semiconductor device, a semiconductor substrate 100 is provided. An insulation structure 101 and a plurality of fin structures 110 are formed on the semiconductor substrate 100. The insulation structure 101 covers a portion of the sidewall surfaces of each fin structure 110. A patterned layer 102 may be formed on the insulation layer 101. The patterned layer 102 exposes the plurality of fin structures 110. An ion implantation process is performed on the plurality of fin structures 110 using the patterned layer 102 as a mask.

FIG. 2 illustrates a schematic top view of the semiconductor device. Referring to FIG. 2, after performing the ion implantation process, a plurality of dummy gate structures 120 are formed on the isolation structure across the plurality of fin structures 110. After forming the plurality of dummy gate structures 120, a plurality of source/drain doped regions 130 are formed in the plurality of fin structures 110 on the two opposite sides of each dummy gate structure 120.

With the development of semiconductor technology, the size of semiconductor devices becomes smaller and smaller, and accordingly, the distance between different fin structures may also be reduced. However, as the component density increases, the heat generated in the semiconductor device may not be able to be rapidly conducted out through the semiconductor substrate. The fin structures close to the edges of the semiconductor device may have large margins, such that the heat generated in these fin structures may be easily dispersed. However, the heat in the channel regions of the fin structures in the center of the semiconductor device may be difficult to be transmitted out, and thus the temperature of the fin structures in the center of the semiconductor device may be high. As such, the performance of the semiconductor device may not be desired.

Figure 3:
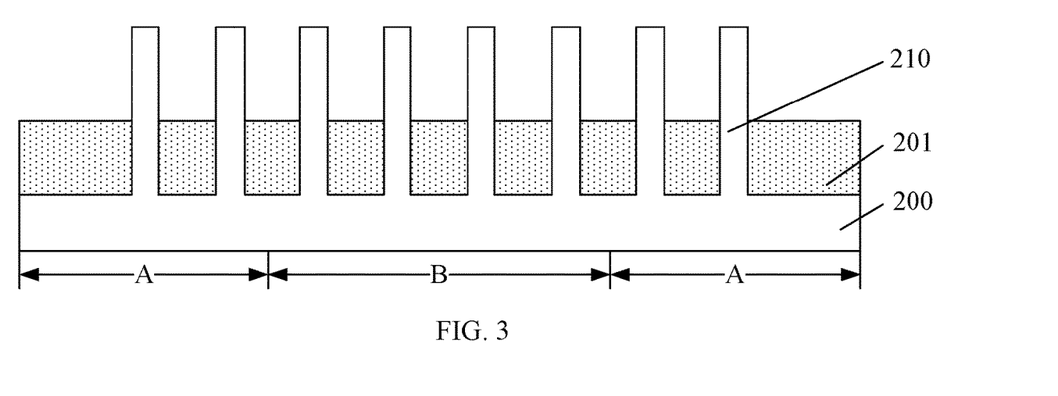
FIGS. 3-5 illustrate schematic views of semiconductor structures at certain stages of an exemplary method for fabricating a semiconductor structure consistent with some embodiments of the present disclosure.
Figure 4:
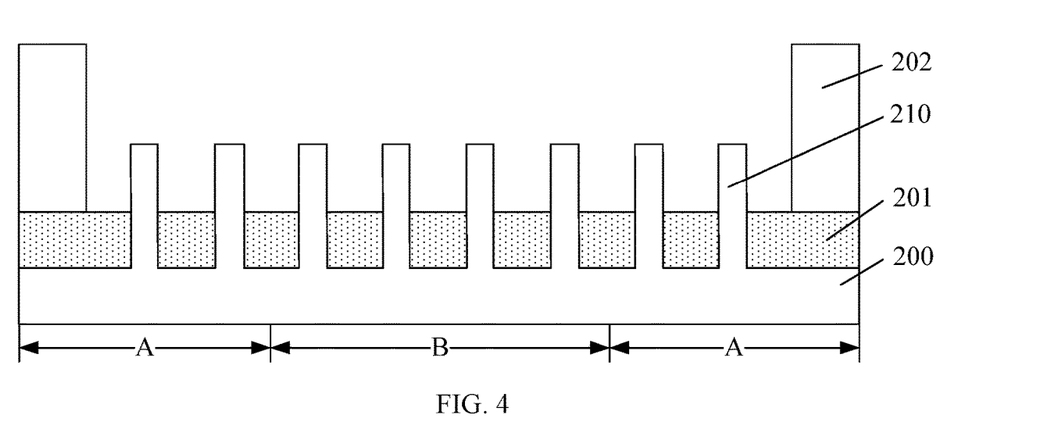
Figure 5:
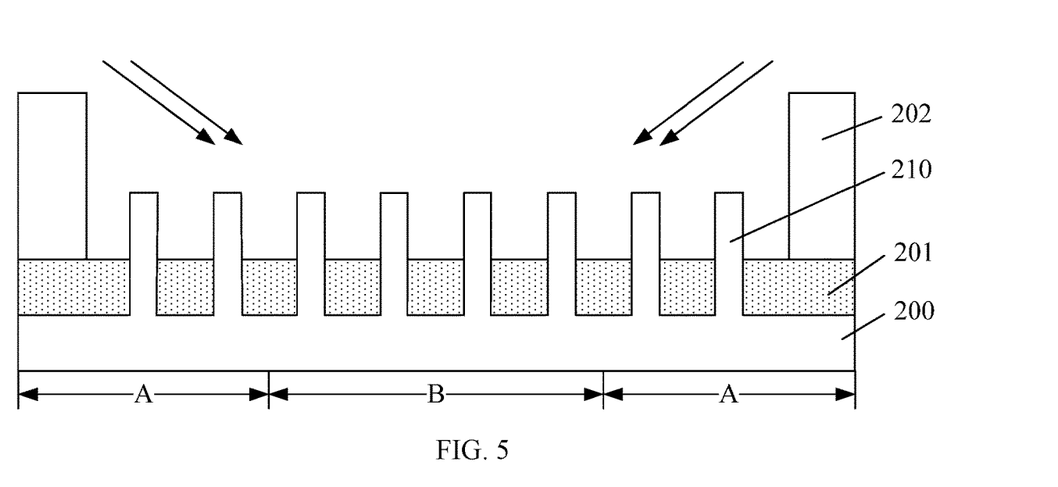
Figure 12:
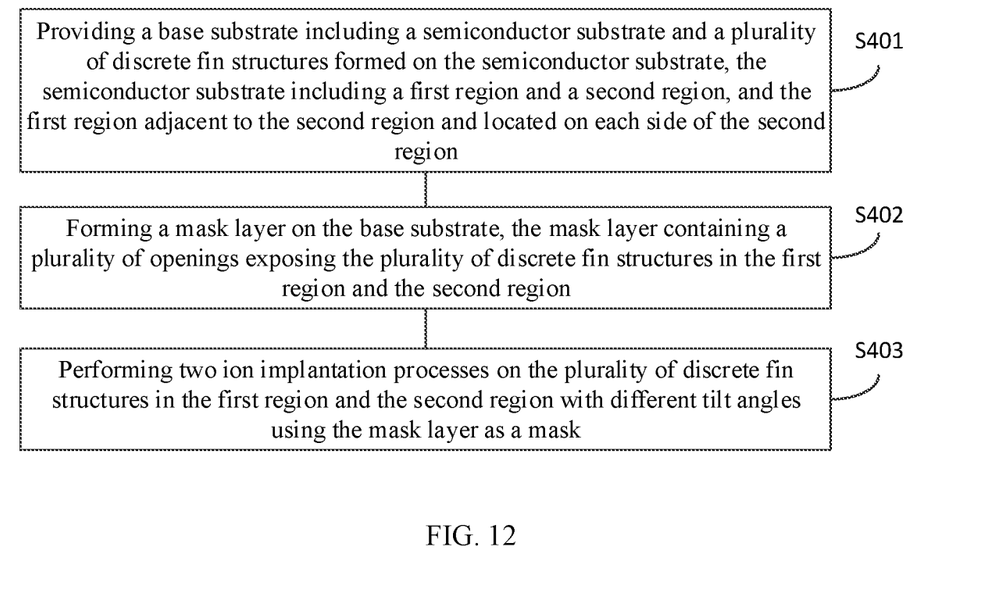
FIG. 12 illustrates a flowchart of an exemplary method for fabricating semiconductor devices consistent with various embodiments of the present disclosure.

The present disclosure provides a method for fabricating semiconductor devices with improved performance. FIG. 12 illustrates a flowchart of an exemplary method for fabricating semiconductor devices consistent with various embodiments of the present disclosure. FIGS. 3-5 illustrate schematic views of semiconductor structures at certain stages of the fabrication method.

Referring to FIG. 12, at the beginning of the fabrication process, a base substrate including a semiconductor substrate and a plurality of discrete fin structures formed on the semiconductor substrate may be provided, the semiconductor substrate including a first region and a second region with the first region adjacent to the second region and located on each side of the second region (S401). FIG. 3 illustrates a schematic cross-sectional view of a semiconductor structure consistent with various embodiments of the present disclosure.

Referring to FIG. 3, a base substrate may be provided. In one embodiment, the base substrate may include a semiconductor substrate 200 and a plurality of discrete fin structures 210 formed on the surface of the semiconductor substrate 200. In other embodiments, the base substrate may be a planer substrate.

In one embodiment, the semiconductor substrate 200 may include a first region A and a second region B. The first region A may be located on each side of the second region B and may be laterally connected to the second region B. The plurality of fin structures 210 may be distributed in both the first region A and the second region B of the semiconductor substrate 200. For example, the plurality of fin structures 210 may include a first plurality of fin structures 210 formed in the first region A and a second plurality of fin structures formed in the second region B.

In one embodiment, the semiconductor substrate 200 may be made of single-crystalline silicon. In some other embodiments, the semiconductor substrate may be made of polycrystalline silicon or amorphous silicon. Alternatively, the semiconductor substrate may be made of germanium, SiGe, GaAs, or any other appropriate semiconductor material. In addition, in some embodiments, the semiconductor substrate may be a semiconductor-on-insulator structure. The semiconductor-on-insulator structure may include an insulator and a semiconductor layer disposed on the insulator. For example, the semiconductor layer in the semiconductor-on-insulator structure may be made of silicon, germanium, SiGe, GaAs, InGaAs, or any other appropriate semiconductor material.

In one embodiment, the plurality of fin structures 210 may be formed by patterning the semiconductor substrate 200. In other embodiments, the plurality of fin structures may be formed through the following exemplary steps. First, a fin structure material layer may be formed on the semiconductor substrate. Then, the fin structure material layer may be patterned to form the plurality of fin structures.

In one embodiment, the plurality of fin structures 210 may be made of single-crystalline silicon. In other embodiments, the plurality of fin structures may be made of single-crystalline SiGe, or any other appropriate semiconductor material.

In one embodiment, an insulation layer 201 may also be formed on the semiconductor substrate 200. The insulation layer 201 may cover a portion of the sidewall surfaces of each fin structure 210. In addition, the top surface of the insulation layer 201 may be lower than the top surfaces of the plurality of fin structures 210. The insulation layer 201 may be made of a material including silicon oxide.

In one embodiment, a protective layer (not shown) may be formed on the surface of the plurality of fin structures 210. The protective layer may provide protection for the plurality of fin structures 210 during an ion implantation process that is subsequently performed on the plurality fin structures 210.

The protective layer may be made of a material including silicon oxide, silicon nitride, SiCN, SiBN, SiCON, or SiON. In one embodiment, the protective layer is made of silicon oxide.

In other embodiments, the base substrate may further include a third region. The third region may be located on each side of the second region and laterally connected to the first region and the second region. That is, the third region may be adjacent to the first region and the second region.

Further, a first doped region may be formed in the first plurality of fin structures 210 of the first region A, and a second doped region may be formed in the second plurality of fin structures 210 of the second region B. The doping ions in the first doped region may have a same type as the doping ions in the second doped region, and the concentration of the doping ions in the first doped region may be lower than the concentration of the doping ions in the second doped region.

The fabrication process of the first doped region may include an ion implantation process or a solid state source doping process. The fabrication process of the second doped region may include an ion implantation process or a solid state source doping process. For example, in some embodiments, the fabrication process of the first doped region may be an ion implantation process, and the fabrication process of the second doped region may be a solid state source doping process. In some other embodiments, the fabrication process of the first doped region may be a solid state source doping process, and the fabrication process of the second doped region may be an ion implantation process.

In one embodiment, the first doped region and the second doped region may each be fabricated through an ion implantation process. FIGS. 4-5 illustrate schematic diagrams of the method for fabricating the first doped region and the second doped region.

Returning to FIG. 12, a mask layer may be formed on the base substrate, the mask layer containing a plurality of openings exposing the plurality of discrete fin structures in the first region and the second region (S402). FIG. 4 illustrates a schematic cross-sectional view of a corresponding semiconductor structure consistent with some embodiments of the present disclosure Referring to FIG. 4, a mask layer 202 may be formed on the base substrate. The mask layer 202 may define the positions and the shapes of the plurality of fin structures 210 in the first region A and the second region B that are intended to be implanted.

The mask layer 202 may be made of a material including silicon oxide or silicon nitride, or may be a coated organic layer.

In one embodiment, the mask layer 202 may be made of a photoresist material. The fabrication process of the mask layer 202 may include a coating process and, following the coating process, a photolithography process. The mask layer 202 may provide protection for the semiconductor substrate 200 during the subsequently-performed ion implantation process. The mask layer 202 may be formed by a method including the following exemplary steps. An initial mask layer (not shown) may be coated on the surface of the semiconductor substrate 200, and an exposure and development process may be performed on the initial mask layer to define the positions and the shapes of the plurality of fin structures 210 in the first region A and the second region B that are intended to be implanted. As such, the mask layer 202 may be formed.

In other embodiments, the mask layer 202 may be made of silicon oxide or silicon nitride. The mask layer 202 may be formed by a method including the following exemplary steps. An initial mask layer may be formed on the surface of the semiconductor substrate 200. The initial mask layer may be made of a material including silicon oxide or silicon nitride. A first patterned layer may be formed on the surface of the initial mask layer. The first patterned layer may define the positions and the shapes of the plurality of fin structures 210 in the first region A and the second region B that are intended to be implanted. The initial mask layer may be etched using the first patterned layer as an etch mask until the surface of the semiconductor substrate 200 is exposed. As such, the mask layer 202 may be formed. The first patterned layer may be made of a photoresist material.

A distance from the mask layer 202 to the fin structure 210 at the edge of the first region A may be in a range of approximately 30 nm to 300 nm.

When the distance from the mask layer 202 to the fin structure 210 at the edge of the first region A is smaller than 30 nm, the range affected by the shadow effect of the mask layer may reach the second plurality of fin structures in the second region B, thus affecting the doping of the second plurality of fin structures in the second region B. When the distance from the mask layer 202 to the fin structure 210 at the edge of the first region A is larger than 300 nm, an excessively large thickness of the mask layer may be required in order to achieve the similar shadow effect during the ion implantation process. However, the result may still not be desired.

In one embodiment, the vertical distance from the top surface of the mask layer 202 to the top surface of the fin structures 210 may be N times of the height of the fin structures 210, where N is an integer greater than or equal to 1, and represents the number of the fin structures 210 in the first region A on one side of the second region B. That is, the thickness of the mask layer 202 may be (N+1) times of the height of the fin structures 210.

In one embodiment, the mask layer 202 may be used as a mask during the ion implantation process. The combination of the height of the mask layer 202 and the distance from the mask layer 202 to the fin structures 210 may play the major role. Further, by combining the tilt angle during the ion implantation process, the shadow effect may be able to ensure the first region A that is close to the mask layer 202 to have a low concentration of the doping ions or to not receive doping ions. As such, the concentration of the doping ions in the second region B may be higher than the concentration of the doping ions in the first region A, and thus the threshold voltage of the transistors formed in the second region B may be higher than the threshold voltage of the transistors formed in the first region A. Therefore, the channel turn-on voltage of the transistors in the second region may be large, and the current in the channels may be small, and thus the heat generated in the second plurality of fin structures 210 of the second region B may be limited so that the temperature of the fin structures 210 in the center may be low. That is, heat accumulation may be less likely take place in the center region. Therefore, self-heating effect may not be severe, and thus the performance of the semiconductor device may be improved.

Further, returning to FIG. 12, after forming the mask layer, two ion implantation processes may be performed on the plurality of discrete fin structures in the first region and the second region with different tilt angles using the mask layer as a mask (S403). FIG. 5 illustrates a schematic cross-sectional view of a semiconductor structure consistent with some embodiments of the present disclosure.

Referring to FIG. 5, after forming the mask layer 202, two ion implantation processes may be performed to implant doping ions into the plurality of fin structures 210 in the first region A and the second region B. During the two ion implantation processes, ions may be implanted into the plurality of fin structures 210 along two different directions with each having a tilt angle with respect to the normal direction of the semiconductor substrate. In one embodiment, the two implantation directions may be symmetrical along the normal direction of the semiconductor substrate. Because the mask layer 202 serves as a mask during the ion implantation process, the concentration of the doping ions in the second plurality of fin structures 210 of the second region B may be higher than the concentration of the doping ions in the fin structures 210 of the first region A, e.g., in the first plurality of fin structures 210 in the first region A.

In one embodiment, implanting ions into the plurality of fin structures 210 in the first region A and the second region B may include the following exemplary steps. Using the mask layer 202 as a mask, a first ion implantation process may be performed on the plurality of fin structures 210 in the first region A and the second region B. After performing the first ion implantation process, a second ion implantation process may be performed on the plurality of fin structures 210 in the first region A and the second region B. The implantation direction of the first ion implantation process and the implantation direction of the second ion implantation process may be symmetrical along the normal direction of the semiconductor substrate. The implantation direction of the first ion implantation process and the implantation direction of the second ion implantation process may be perpendicular to the extending direction of the fin structures 210.

When the plurality of fin structures 210 are used to form an N-type device, the doping ions may be P-type ions, including phosphor ions or arsenic ions. When the plurality of fin structures 210 are used to form a P-type device, the doping ions may be N-type ions, including boron ions, $BF^2$ ions, or indium ions.

In one embodiment, the plurality of fin structures 210 may be used to form an N-type device, and the parameters used in the first ion implantation process and the second ion implantation process may include phosphor ions or arsenic ions as the doping ions implanted, an implantation energy in a range of approximately 10 keV to 30 keV, an implantation dose in a range of approximately 1E13 atom/cm$^2$ to 5E14 atom/cm$^2$, and a tilt angle in a range of approximately 10° to 40°. The tilt angle refers to an angle between the implantation direction and the normal direction of the plane of the base substrate.

In one embodiment, the tilt angle may be in a range of approximately 10° to 40°. Having a tilt angle, a thickness of the mask layer 202, and a distance from the mask layer 202 to the fin structure 210 at the edge of the first region A in the corresponding ranges described above may ensure that the fin structures 210 in the first region A on one side of the second region B can be shadowed by the mask layer 202 during each ion implantation processes. As such, the concentration of the doping ions in the second region B may be higher than the concentration of the doping ions in the first region A, and thus the threshold voltage of the transistors formed in the second region B may be higher than the threshold voltage of the transistors formed in the first region A. Therefore, the turn-on voltage of channels of the transistors in the second region may be large, and the current in the channels may be small, and thus the heat generated in the second plurality of fin structures 210 of the second region B may be limited so that the temperature of the fin structures 210 in the center may be low. That is, heat accumulation may be less likely take place in the center region. Therefore, self-heating effect may not be severe, and thus the performance of the semiconductor device may be improved.

For example, assuming that the width of the fin structures is D1, the height of the plurality of fin structures 210 is H1, the distance from the fin structure 210 near the inner edge of the first region A to the mask layer is A1, the distance between adjacent fin structures 210 is A2, the height (i.e., thickness) of the mask layer is H2, where H2=(N+1)H1, and the tilt angle of the implantation process is α, then tan $$\alpha = \frac{ND1 + A1 + (N-1)A2}{NH1}.$$

In other embodiments, the plurality of fin structures may be used to form a P-type device, and the parameters used in the first ion implantation process and the second ion implantation process may include boron ions or $BF^{2-}$ ions as the doping ions implanted, an implantation energy in a range of approximately 10 keV to 30 keV, an implantation dose in a range of approximately 1E13 atom/cm$^2$ to 5E14 atom/cm$^2$, and a tilt angle in a range of approximately 10° to 40°. The tilt angle refers to an angle between the implantation direction and the normal direction of the plane of the base substrate.

In one embodiment, after performing the second ion implantation process, the fabrication method may further include performing an anneal process on the plurality of fin structures 210 in the first region A and the second region B, which may be conducive to repair the damages in the fin structures 210 caused by the ion implantation process, and in the meantime, may also activate the doping ions in the fin structures 210.

In other embodiments, the fabrication process for the first doped region and the second doped region may both be formed by the solid state source doping process. That is, the doping process performed on the plurality of fin structures in the first region and the second region may be a solid state source doping process.

The method for forming the first doped region and the second doped region may include the following exemplary steps. A first doped layer containing first doping ions may be formed on the surfaces of the first plurality of fin structures 210 in the first region A of the base substrate. The concentration of the first doping ions in the first doped layer may be a first concentration. A second doped layer containing second doping ions may be formed on the surfaces of the second plurality of fin structures 210 in the second region B of the base substrate. The second doping ions may have the same doping type as the first doping ions. The concentration of the second doping ions in the second doped layer may be a second concentration, and the second concentration may be larger than the first concentration. After forming the first doped layer and the second doped layer, an annealing process may be performed on the first doped layer and the second doped layer to allow the first doping ions to enter the first plurality of fin structures 210 in the first region A and the second doping ions to enter the second plurality of fin structures 210 in the second region B.

When the plurality of fin structures 210 are used to form a P-type device, the material of the first doped layer may include silicon or SiGe, and the first doping ions may be P-type doping ions, including phosphor ions or arsenic ions. The second doped layer may include silicon or SiGe, and the second doping ions may be P-type doping ions, including phosphor ions or arsenic ions.

When the plurality of fin structures 210 are used to form an N-type device, the material of the first doped layer may include silicon oxide or silicon nitride, and the first doping ions may be N-type doping ions, including boron ions, $BF^{2-}$ ions, or indium ions. The second doped layer may include silicon oxide or silicon nitride, and the second doping ions may be N-type doping ions, including boron ions, $BF^2$ ions, or indium ions.

In some other embodiments, the base substrate may also include a third region. The third region may be located on each side of the second region and may be connected to the first region and the second region. That is, the third region may be adjacent to the first region and the second region. The plurality of fin structures formed on the base substrate may further include a third plurality of fin structures formed in the third region. A third doped region may be formed in the third plurality of fin structures in the third region. The concentration of the doping ions in the third doped region may be larger than the concentration of the doping ions in the first doped region, but may be smaller than the concentration of the doping ions in the second doped region. The doping type of the doping ions in the third doped region may be the same as the doping type of the doping ions in the first doped region and the second doped region.

The process for forming the third doped region in the third plurality of fin structures in the third region may include an ion implantation process or a solid state doping process.

Further, in one embodiment, after forming the first doped region and the second doped region, a plurality of gate structures may be formed on the first doped region and the second doped region across the plurality of fin structures. Each gate structure may include a gate dielectric layer and a gate electrode formed on the surface of the gate dielectric layer. The gate dielectric layer may cover a portion of top surface and a portion of sidewall surface of each fin structure.

Further, the present disclosure also provides a semiconductor device formed through the method described above and illustrated in FIGS. 3-5. Referring to FIG. 5, the semiconductor device may include a base substrate. The base substrate may include a semiconductor substrate 200 and a plurality of discrete fin structures 210 formed on the surface of the semiconductor substrate 200. In other embodiments, the base substrate may be a planer substrate.

In one embodiment, the semiconductor substrate 200 may include a first region A and a second region B. The first region A may be located on each side of the second region B and may be laterally connected to the second region B. The plurality of fin structures 210 may be distributed in both the first region A and the second region B. For example, the plurality of fin structures 210 may include a first plurality of fin structures 210 formed in the first region A and a second plurality of fin structures 210 formed in the second region B.

In one embodiment, the semiconductor substrate 200 may be made of single-crystalline silicon. In some other embodiments, the semiconductor substrate may be made of polycrystalline silicon or amorphous silicon. Alternatively, the semiconductor substrate may be made of germanium, SiGe, GaAs, or any other appropriate semiconductor material. In addition, in some embodiments, the semiconductor substrate may be a semiconductor-on-insulator structure. The semiconductor-on-insulator structure may include an insulator and a semiconductor layer disposed on the insulator. For example, the semiconductor layer in the semiconductor-on-insulator structure may be made of silicon, germanium, SiGe, GaAs, InGaAs, or any other appropriate semiconductor material.

In one embodiment, the plurality of fin structures 210 may be made of single-crystalline silicon. In other embodiments, the plurality of fin structures may be made of single-crystalline SiGe, or any other appropriate semiconductor material.

In one embodiment, an insulation layer 201 may also be formed on the semiconductor substrate 200. The insulation layer 201 may cover a portion of the sidewall surfaces of each fin structure 210. In addition, the top surface of the insulation layer 201 may be lower than the top surfaces of the plurality of fin structures 210. The insulation layer 201 may be made of a material including silicon oxide.

In one embodiment, a protective layer (not shown) may be formed on the surface of the plurality of fin structures 210. The protective layer may be made of a material including silicon oxide, silicon nitride, SiCN, SiBN, SiCON, or SiON. In one embodiment, the protective layer is made of silicon oxide.

Further, the semiconductor device may include a first doped region formed in the first plurality of fin structures 210 in the first region A and a second doped region formed in the second plurality of fin structures 210 in the second region B. The doping ions in the first doped region may have a same type as the doping ions in the second doped region, and the concentration of the doping ions in the first doped region may be lower than the concentration of the doping ions in the second doped region.

In other embodiments, the base substrate of the semiconductor device may further include a third region. The third region may be located on each side of the second region and may be laterally connected to the first region and the second region. That is, the third region may be adjacent to the first region and the second region. The plurality of fin structures formed on the base substrate may further include a third plurality of fin structures formed in the third region. The semiconductor device may also include a third doped region formed in the third plurality of fin structures in the third region. The concentration of the doping ions in the third doped region may be larger than the concentration of the doping ions in the first doped region, but may be smaller than the concentration of the doping ions in the second doped region. The doping type of the doping ions in the third doped region may be the same as the doping type of the doping ions in the first doped region and the second doped region.

In one embodiment, the semiconductor device may also include a plurality of gate structures formed on the first doped region and the second doped region across the plurality of fin structures. Each gate structure may include a gate dielectric layer and a gate electrode formed on the surface of the gate dielectric layer. The gate dielectric layer may cover a portion of top surface and a portion of sidewall surface of each fin structure.

Figure 13:
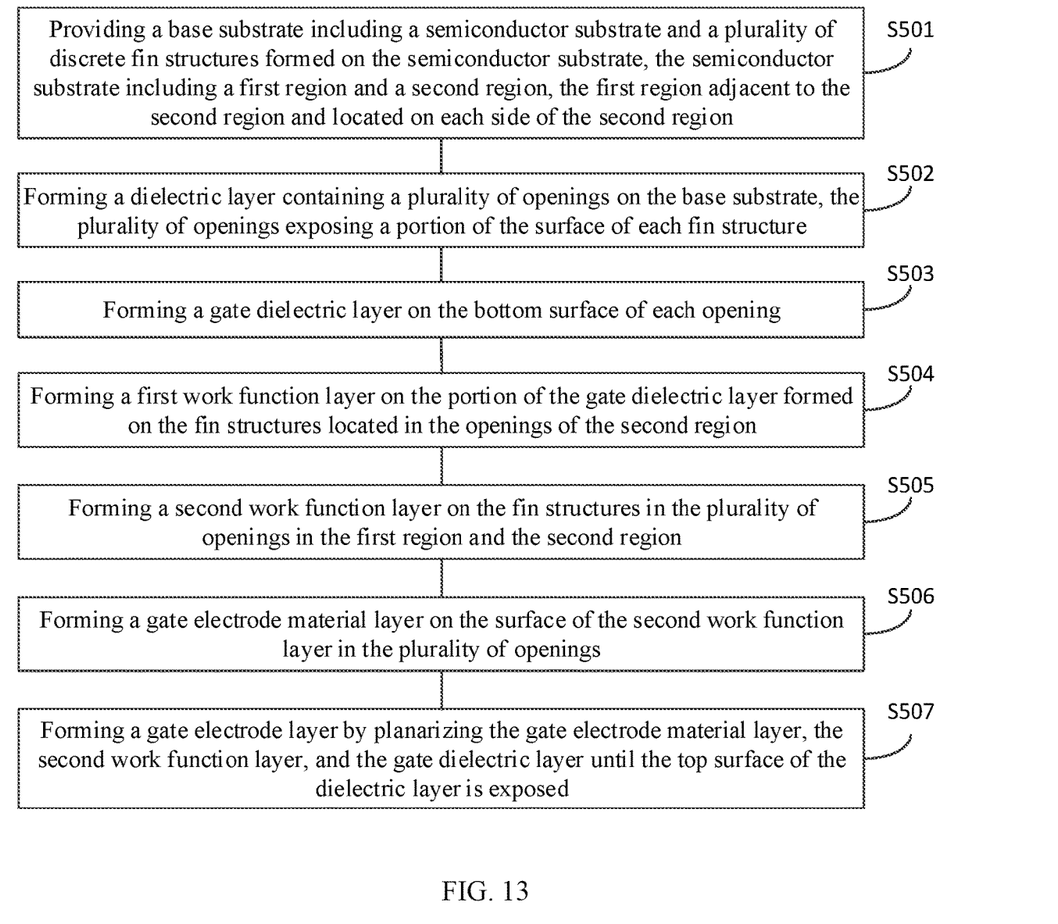
FIG. 13 illustrates a flowchart of another exemplary method for fabricating semiconductor devices consistent with various embodiments of the present disclosure.

The present disclosure further includes another method for fabricating semiconductor devices. FIG. 13 illustrates a flowchart of an exemplary method for fabricating semiconductor devices consistent with various embodiments of the present disclosure. FIGS. 6-11 illustrate schematic views of semiconductor structures at certain stages of the fabrication method.

Figure 6:
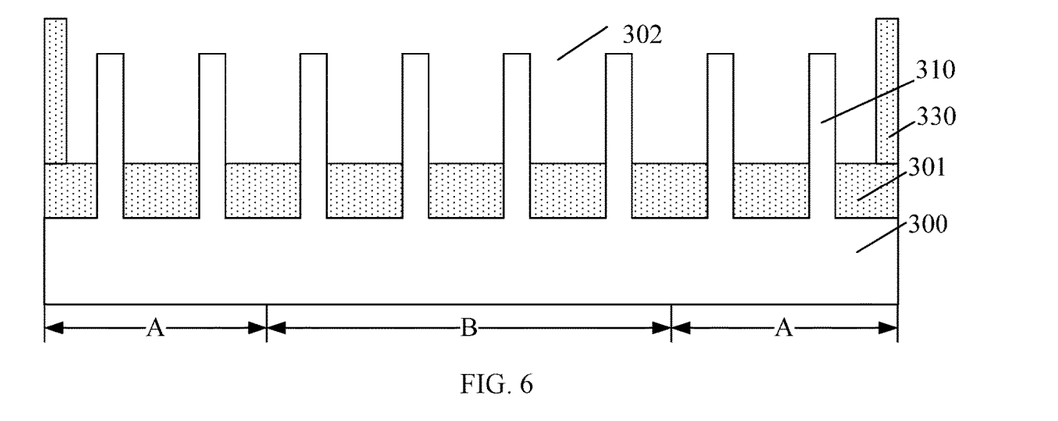
FIGS. 6-11 illustrate schematic views of semiconductor structures at certain stages of another exemplary method for fabricating a semiconductor structure consistent with some embodiments of the present disclosure.

Referring to FIG. 13, at the beginning of the fabrication process, a base substrate including a semiconductor substrate and a plurality of discrete fin structures formed on the semiconductor substrate may be provided, the semiconductor substrate including a first region and a second region with the first region adjacent to the second region and located on each side of the second region (S501). FIG. 6 illustrates a schematic cross-sectional view of a semiconductor structure consistent with some embodiments of the present disclosure.

Referring to FIG. 6, a base substrate may be provided. The base substrate may include a semiconductor substrate 300 and a plurality of discrete fin structures 310 formed on the semiconductor substrate 300. An insulation layer 301 may be formed on the base substrate. The insulation layer 301 may cover a portion of the sidewall surfaces of each fin structure 310.

In one embodiment, the semiconductor substrate 300 may include a first region A and a second region B. The first region A may be located on each side of the second region B and may be laterally connected to the second region B. The plurality of fin structures 310 may be distributed in both the first region A and the second region B of the semiconductor device 300. For example, the plurality of fin structures 310 may include a first plurality of fin structures 310 formed in the first region A and a second plurality of fin structures 310 formed in the second region B. The formation process, the material used, the dimensions, and the shapes of the semiconductor substrate, the fin structures, and the insulation layer may be substantially the same as those of the semiconductor structure shown in FIG. 3, and for more details, reference may be made to the illustration of the embodiments provided above.

Further, returning to FIG. 13, a dielectric layer containing a plurality of openings may be formed on the base substrate, the plurality of openings exposing a portion of the surface of each fin structure (S502). Referring to FIG. 6, a dielectric layer 330 may be formed on the base substrate, and a plurality of openings 302 may be formed in the dielectric layer 330 to expose a portion of the surface of each fin structure 310. The plurality of openings 302 may include a first plurality of openings 302 formed in the first region A and a second plurality of openings 302 formed in the second region B. The dielectric layer 330 may be used to electrically isolate adjacent semiconductor devices.

The method for forming the plurality of openings 302 may include the following exemplary steps. A plurality of dummy gate structures may be formed on the base substrate across the plurality of fin structures 310. Each dummy gate structure may include a dummy gate dielectric layer and a dummy gate electrode formed on the surface of the dummy gate dielectric layer. A dielectric layer 330 may be formed on the surface of the base substrate. The top surface of the dielectric layer 330 may be leveled with the top surfaces of the plurality of dummy gate structures. Further, the plurality of dummy gate structures may be removed to form the plurality of openings 302.

The method for forming the dielectric layer 330 may include the following exemplary steps. An initial dielectric layer may be formed on the base substrate to cove the top surfaces of the plurality of dummy gate structures. After forming the initial dielectric layer, a planarization process may be performed on the initial dielectric layer until the top surfaces of the plurality of dummy gate structures are exposed. As such, the dielectric layer 330 with the top surface leveled with the top surfaces of the plurality of dummy gate structures may be formed.

In one embodiment, prior to forming the initial dielectric layer, the method for forming the plurality of openings 302 may further include forming a source/drain doped layer in the fin structures 310 on the both sides of each dummy gate structure. The source/drain doped layer may include a plurality of source/drain doped layer units in the fin structures 310 on both sides of each dummy gate structure.

In one embodiment, the dummy gate electrode may be made of poly-crystalline silicon, and the dummy gate dielectric layer may be made of silicon oxide.

The dielectric layer 330 may be made of a material including silicon oxide or silicon nitride. In one embodiment, the dielectric layer 330 is made of silicon oxide.

Figure 7:
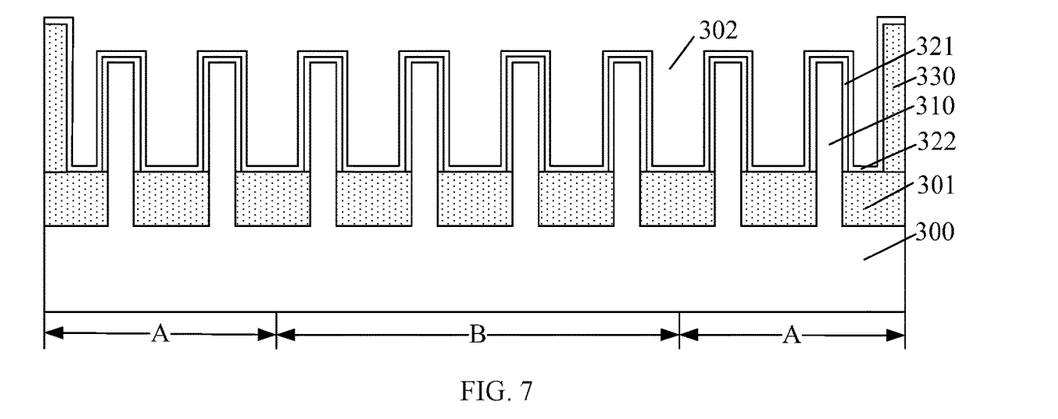

Further, returning to FIG. 13, a gate dielectric layer may be formed on the bottom surface of each opening (S503). FIG. 7 illustrates a schematic cross-sectional view of a semiconductor structure consistent with some embodiments of the present disclosure.

Referring to FIG. 7, a gate dielectric layer 322 may be formed on the bottom surface of each opening 302. In one embodiment, prior to forming the gate dielectric layer 322 on the bottom surface of each opening 302, the fabrication method may further include forming an interface layer 321 on the surface of each fin structure 310 exposed on the bottom of the corresponding opening 302. Accordingly, the gate dielectric layer may be formed on the surface of the interface layer 321 on the bottom surface of each opening 302.

The interface layer 321 may be used to improve the bonding strength between the gate dielectric layer 322 and the plurality of fin structures 310. In addition, the interface layer 321 may also be able to repair the defects at the interface between the gate dielectric layer 322 and the plurality of fin structures 310.

The interface layer 321 may be formed through an oxidation process, for example, a thermal oxidation process or a wet oxidation process. In one embodiment, the interface layer 321 is formed through a thermal oxidation process.

The interface layer 321 may be made of silicon oxide or silicon nitride. In one embodiment, the interface layer 321 is made of silicon oxide.

The gate dielectric layer 322 may be made of a material with a large dielectric constant k (k is larger than 3.9). For example the gate dielectric layer 322 may be made of a material including $HfO_2$, $ZrO_2$, HfSiO, $La_2O_3$, ZrSiO, $TiO_2$, $Ta_2O_5$, $BaSrTiO_x$, $BaTiO_3$, $SrTiO_3$, $Al_2O_3$, etc. In one embodiment, the gate dielectric layer 322 is made of $HfO_2$.

The process of forming the gate dielectric layer 322 may include chemical vapor deposition (CVD), physical vapor deposition (PVD), or atomic layer deposition (ALD). In one embodiment, the gate dielectric layer 322 is formed through a CVD process.

Figure 8:
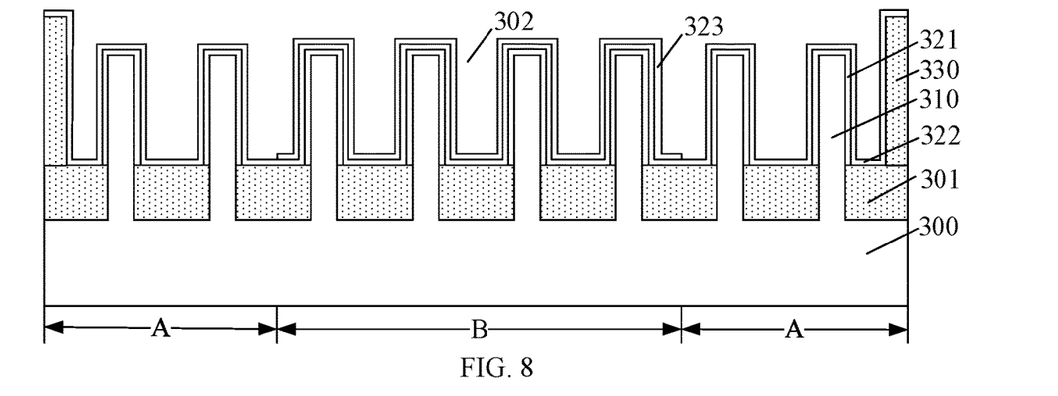

Further, returning to FIG. 13, after forming the gate dielectric layer, a first work function layer may be formed on the portion of the gate dielectric layer formed on the fin structures that are located in the openings of the second region (S504). FIG. 8 illustrates a schematic cross-sectional view of a semiconductor structure consistent with some embodiments of the present disclosure.

Referring to FIG. 8, after forming the gate dielectric layer 322, a first work function layer 323 may be formed on the surface of the portion of the gate dielectric layer 322 on the second plurality of fin structures 310 that are located in the openings 302 of the second region B, e.g., in the second plurality of openings 302 of the second region B.

In one embodiment, the first work function layer 323 may serve as a part of the work function layer on the second plurality of fin structures 310 in the second region B. The first work function layer 323 may be used to adjust the thickness of the work function layer on the second plurality of fin structures 310 in the second region B such that the threshold voltage of the work function layer formed on the second plurality of fin structures 310 in the second region B may be larger than the threshold voltage of the work function layer formed on the first plurality of fin structures 310 in the first region A.

The method for forming the first work function layer 323 may include the following exemplary steps. First, a first work functional material layer may be formed on the surface of the gate dielectric layer 322 on each fin structure 310 in the openings 310. After forming the first work function material layer, a second patterned layer may be formed on the surface of the first work function material layer. The second patterned layer may define the positions and the shapes of the first plurality of openings 310 in the first region A. Further, the first work function material layer formed on the surface of the portion of the gate dielectric layer 322 formed in the first plurality of openings 302 in the first region A may be removed through etching using the second patterned layer as an etch mask. As such, the first work function layer 323 may be formed.

In some embodiments, the plurality of fin structures 310 may be used to form an N-type device, and accordingly, the first work function layer may be made of an N-type work function material. The N-type work function material layer may include TiN or TaN.

In other embodiments, the plurality of fin structures may be used to form a P-type device, and accordingly, the first work function layer may be made of a P-type work function material. The P-type work function material may include TaC, Ti, Al, or TiAl.

In one embodiment, the first work function layer 323 is made of an N-type work function material, and the N-type work function material layer includes TiN or TaN.

In one embodiment, the first work function layer 323 is made of TiN, and the thickness of the first work function layer 323 may be in a range of approximately 10 Å to 30 Å. When the thickness of the first work function layer 323 is smaller than 10 Å, the first work function layer 323 may not be able to effectively adjust the work function of the work function layer in the second region B. When the thickness of the first work function layer 323 is larger than 30 Å, the threshold voltage of the semiconductor device formed subsequently may be overly adjusted due to the excessively large thickness of the first work function layer 323, which may be adverse to the desired performance of the semiconductor device.

The method for forming the first work function material layer may include CVD, PVD, or ALD.

In one embodiment, after forming the gate dielectric layer 322 and prior to forming the first work function layer 323, the fabrication method may further include forming a cover layer (not shown) on the surface of the portion of the gate dielectric layer 322 formed on the sidewall and the top surfaces of the openings 310.

The cover layer may be able to prevent the gate dielectric layer 322 from being exposed into the process gas during the subsequently performed annealing process. Moreover, the cover layer may provide protection for the gate dielectric layer 322 during the process for forming the first work function layer, and, together with the subsequently-formed work function layer, may adjust the threshold voltage of the transistors.

In one embodiment, the cover layer may be made of a material including TiN or TaN. In other embodiments, the cover layer may not be formed.

Figure 9:
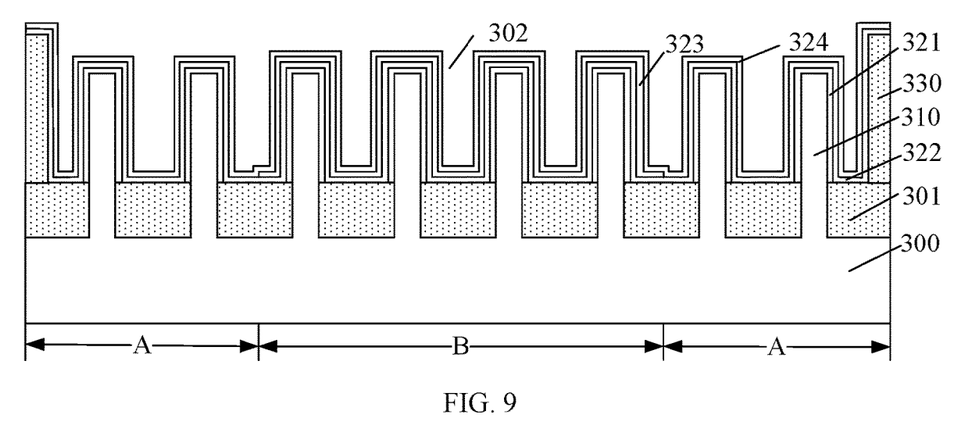

Further, returning to FIG. 13, after forming the first work function layer, a second work function layer may be formed on the fin structures in the plurality of openings in the first region and the second region (S505). FIG. 9 illustrates a schematic cross-sectional view of a semiconductor structure consistent with some embodiments of the present disclosure.

Referring to FIG. 9, after forming the first work function layer 323, a second work function layer 324 may be formed on the fin structures 310 in the plurality of openings 302. That is, the second work function layer 324 may be formed in the openings 302 in both the first region A and the second region B.

The second work function layer 324 may be used to protect the gate dielectric layer 322. The second work function layer 324 may prevent the material of subsequently-formed gate electrodes from diffusing into the gate dielectric layer 322, and thus ensure that the dielectric constant of the gate dielectric layer 322 cannot be easily changed. As such, the threshold voltage of the formed transistors may not be easily shifted.

In some embodiments, the plurality of fin structures 310 may be used to form an N-type device, and accordingly, the second work function layer 324 may be made of an N-type work function material. The N-type work function material may include TiN or TaN.

In other embodiments, the plurality of fin structures may be used to form a P-type device, and accordingly, the second work function layer may be made of a P-type work function material. The P-type work function material may include TaC, Ti, Al, or TiAl.

In one embodiment, the second work function layer 324 is made of an N-type work function material, and the N-type work function material layer includes TiN or TaN. For example, the second work function layer 324 is made of TiN.

Therefore, for each fin structure 310 formed in the first region A, the second work function layer 324 formed on the fin structure 310 in the corresponding opening 302 of the first region A may form a first work-function adjustment layer on the fin structure 310; for each fin structure 310 formed in the second region B, the first work function layer 323 formed on the fin structure 310 in the corresponding opening 302 of the second region B and the second work function layer 324 formed on the surface of the first work function layer 323 may form a second work function adjustment layer on the fin structure 310. That is, the first work-function adjustment layer formed on the fin structure 310 in an opening 302 of the first region A may include the second work function layer 324; the second work function adjustment layer formed on the fin structure 310 in an opening 302 of the second region B may include the first work function layer 323 formed on the fin structure 310 and the second work function layer 324 formed on the surface of the first work function layer 323.

In one embodiment, after forming the gate dielectric layer 322, a first work-function adjustment layer may be formed on the gate dielectric layer 322 in each opening 302 of the first region A. Before or after forming the first work-function adjustment layer, a second work-function adjustment layer may be formed on the gate dielectric layer 322 in each opening 302 of the second region B. The work function value of the second work-function adjustment layer may be different from the work function value of the first work-function adjustment layer, and the first work-function adjustment layer and the second work-function adjustment layer may have a same work function type. That is, the first work-function adjustment layer and the second work-function adjustment layer may be both N-type, or may be both P-type.

When the plurality of fin structures 310 are used to form an N-type device, the first work-function adjustment layer and the second work-function adjustment layer may be made of an N-type work function material. When the plurality of fin structures 310 are used to form a P-type device, the first work-function adjustment layer and the second work-function adjustment layer may be made of a P-type work function material.

In one embodiment, by controlling the thickness of the first work function layer 323, the thickness of the first work-function adjustment layer formed on each fin structure 310 of the first region A may be smaller than the thickness of the second work function adjustment layer formed on each fin structure 310 in the second region B. Accordingly, the threshold voltage of the channel region in the second plurality of fin structure 310 of the second region B located at the center position may be high, and the channel current in the second plurality of fin structure 310 of the second region B located at the center positon may be reduced. Therefore, the heat generated in the channels in the second plurality of fin structures 310 of the second region B may be limited, and thus the temperature of the fin structures 310 located at the center positon may be low. That is, heat accumulation may be less likely take place in the center region. Therefore, self-heating effect may not be severe, and thus the performance of the semiconductor device may be improved.

When the plurality of fin structures 310 are used to form an N-type device, the first work-function adjustment layer and the second work-function adjustment layer may be made of an N-type work function material. The N-type work function material may include TiN or TaN.

Alternatively, the nitrogen atomic percentage concentration in the first work-function adjustment layer and the nitrogen atomic percentage concentration in the second work-function adjustment layer may be controlled to make the work function value of the first work-function adjustment layer smaller than the work function value of the second work-function adjustment layer.

In one embodiment, the first work-function adjustment layer and the second work-function adjustment layer are made of TiN.

By controlling the nitrogen atomic percentage concentration, the nitrogen atomic percentage concentration in the second work-function adjustment layer may be higher than the nitrogen atomic percentage concentration in the first work-function adjustment layer. As such, the threshold voltage of the transistors based on the second plurality of fin structures 310 in the second region B may be increased, and the current in the channel region of the second plurality of fin structures in the second region B may be reduced. Therefore, the heat generated in the transistors formed in the second region B may be reduced, and the self-heating effect in the multi-fin device may be reduce such that the performance of the semiconductor device may be improved.

In one embodiment, the method for forming the first work-function adjustment layer and the second work-function adjustment layer may include the following exemplary steps. A first initial work-function adjustment layer may be formed on the surface of the gate dielectric layer on the fin structures in the plurality of openings. The portion of the first initial work-function adjustment layer formed in the first plurality of openings of the first region may be removed through an etch-back process, and the portion of the first initial work-function adjustment layer formed in the second plurality of openings of the second region may become the first work-function adjustment layer. After forming the first work-function adjustment layer, the second work-function adjustment layer may then be formed on the fin structures in the first plurality of openings of the first region.

Figure 10:
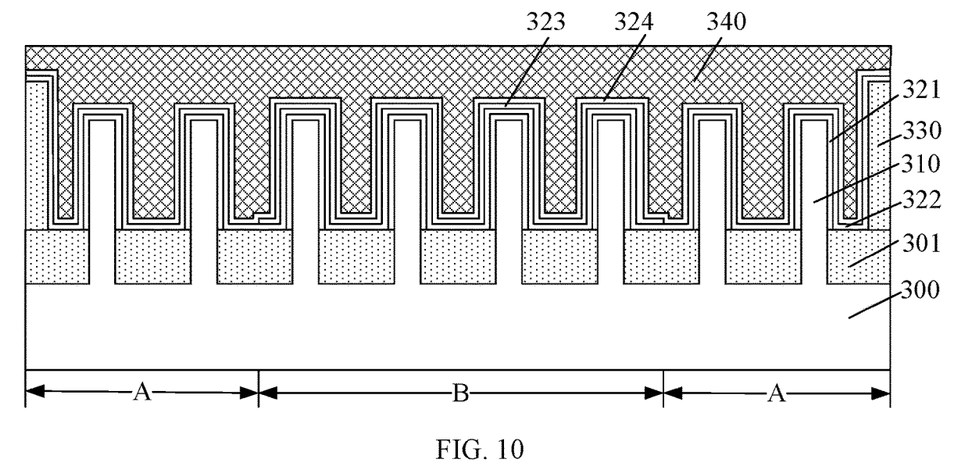

Further, returning to FIG. 13, after forming the second work function layer, a gate electrode material layer may be formed on the surface of the second work function layer in the plurality of openings (S506). FIG. 10 illustrates a schematic cross-sectional view of a semiconductor structure consistent with some embodiments of the present disclosure.

Referring to FIG. 10, after forming the second work function layer 324, a gate electrode material layer 340 may be formed on the surface of the second work function layer 324 in the plurality of openings 310. The gate electrode material layer 340 may be used to provide a material layer for subsequently forming a gate electrode layer.

The method for forming the gate electrode material layer 340 may include plasma chemical vapor deposition, low-pressure chemical vapor deposition, electroplating, or sputtering. For example, the gate electrode material layer 340 may be formed by a process including one or a combination of PVD and electroplating. In one embodiment, the gate electrode material layer 340 is formed by a PVD process.

The gate electrode material layer 340 may be made of a metal including one or more of Cu, W, Ni, Cr, Ti, Ta, Al, etc.

In one embodiment, after forming the second work function layer 324 and prior to forming the gate electrode material layer 340, a barrier layer (not shown) may be formed on the surface of the second work function layer 324. The barrier layer may be used to protect the second work function layer 324.

The method for forming the barrier layer may include CVD, PVD, or ALD. The barrier layer may be made of a material including TaN, Ta, or any other appropriate material. In one embodiment, the barrier layer is made of TaN.

In other embodiments, the fabrication method may not include forming any barrier layer.

In one embodiment, the cover layer, the first work-function layer 323, the barrier layer, and the second work function layer 324 may together adjust the threshold voltage of the semiconductor device to be formed. When the thickness of the barrier layer is too large, the excessively large thickness of the barrier layer may not be conducive to adjusting the threshold voltage of the semiconductor device. However, when the thickness of the barrier layer is too small, the barrier layer may not be able to effectively protect the second work function, and thus the performance of the semiconductor device may be degraded.

Figure 11:
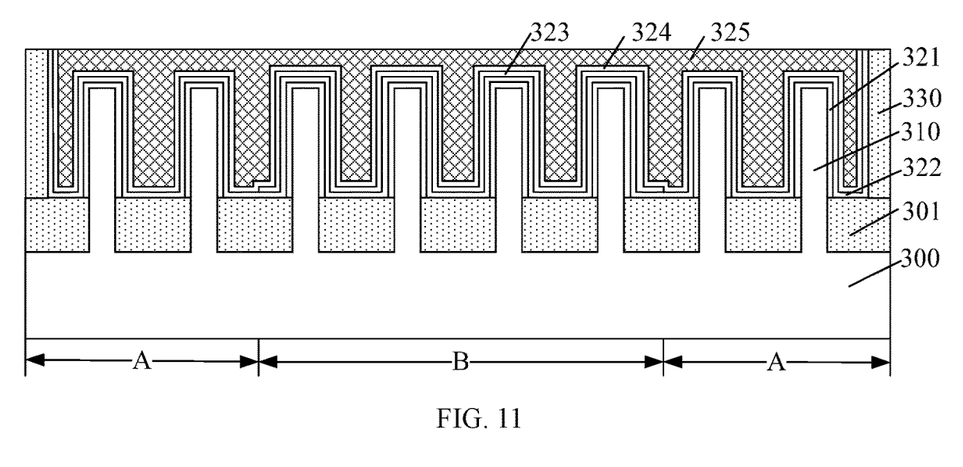

Further, returning to FIG. 13, after forming the gate electrode material layer, a gate electrode layer may be formed by planarizing the gate electrode material layer, the second work function layer, and the gate dielectric layer until the top surface of the dielectric layer is exposed (S507). FIG. 11 illustrates a schematic cross-sectional view of a semiconductor structure consistent with some embodiments of the present disclosure.

Referring to FIG. 11, after forming the gate electrode material layer 340, the gate electrode material layer 342, together with the second work function layer 324 and the gate dielectric layer 322 may be planarized until the top surface of the dielectric layer 330 is exposed. As such, a gate electrode layer 325 may be formed. The gate electrode layer 325 may fill up the plurality of openings 302.

In one embodiment, a barrier layer may be formed on the gate electrode material layer 340. Accordingly, the gate electrode material layer 340, the barrier layer, the second work function layer 324, and the gate dielectric layer 322 may be planarized to form the gate electrode layer 325 as the top surface of the dielectric layer 330 is exposed.

Further, the present disclosure also provides a semiconductor device formed through the method described above and illustrated in FIGS. 6-11. Referring to FIG. 11, the semiconductor device may include a base substrate. The base substrate may include a semiconductor substrate 300 and a plurality of discrete fin structures 310 formed on the semiconductor substrate 300. An insulation layer 301 may be formed on the base substrate. The insulation layer 301 may cover a portion of the sidewall surfaces of each fin structure 310.

In one embodiment, the semiconductor substrate 300 may include a first region A and a second region B. The first region A may be located on each side of the second region B and may be laterally connected to the second region B. The plurality of fin structures 310 may be distributed in both the first region A and the second region B of the semiconductor device 300. For example, the plurality of fin structures 310 may include a first plurality of fin structures 310 formed in the first region A and a second plurality of fin structures 310 formed in the second region B. The formation process, the material used, the dimensions, and the shapes of the semiconductor substrate, the fin structures, and the insulation layer may be substantially the same as those of the semiconductor structure shown in FIG. 5, and for more details, reference may be made to the illustration of the embodiments provided above.

In one embodiment, the semiconductor device may include a dielectric layer 330 formed on the base substrate. The dielectric layer 330 may electrically isolate adjacent semiconductor devices.

In one embodiment, the semiconductor device may include a gate dielectric layer 322 formed cross the plurality of fin structures 310 and covering a portion of the top and sidewall surfaces of each fin structure 310.

In one embodiment, the semiconductor device may also include an interface layer 321 formed between the plurality of fin structures and the gate dielectric layer 322. The interface layer 321 may be used to improve the bonding strength between the gate dielectric layer 322 and the fin structures 310. In addition, the interface layer 321 may also be able to repair the defects at the interface between the gate dielectric layer 322 and the fin structures 310.

The interface layer 321 may be made of silicon oxide or silicon nitride. In one embodiment, the interface layer 321 is made of silicon oxide.

The gate dielectric layer 322 may be made of a material with a large dielectric constant k (k is larger than 3.9). For example the gate dielectric layer 322 may be made of a material including $HfO_2$, $ZrO_2$, HfSiO, $La_2O_3$, ZrSiO, $TiO_2$, $Ta_2O_5$, $BaSrTiO_x$, $BaTiO_3$, $SrTiO_3$, $Al_2O_3$, etc. In one embodiment, the gate dielectric layer 322 is made of $HfO_2$.

The semiconductor device may include a first work function layer 323 formed on the surface of the portion of the gate dielectric layer 322 on the fin structures 310 that are located in the second plurality of openings 302 of the second region B.

In one embodiment, the first work function layer 323 may serve as a part of the work function layer on the second plurality of fin structures 310 in the second region B. The first work function layer 323 may be used to adjust the thickness of the work function layer on the second plurality of fin structures 310 in the second region B such that the threshold voltage of the work function layer formed on the second plurality of fin structures 310 in the second region B may be larger than the threshold voltage of the work function layer formed on the first plurality of fin structures 310 in the first region A.

In some embodiments, the semiconductor device may be an N-type device formed on the plurality of fin structures 310, and accordingly, the first work function layer may be made of an N-type work function material. The N-type work function material layer may include TiN or TaN.

In other embodiments, the semiconductor device may be a P-type device formed on the plurality of fin structures 310, and accordingly, the first work function layer may be made of a P-type work function material. The P-type work function material may include TaC, Ti, Al, or TiAl.

In one embodiment, the first work function layer 323 is made of an N-type work function material, and the N-type work function material layer includes TiN or TaN.

In one embodiment, the first work function layer 323 is made of TiN, and the thickness of the first work function layer 323 may be in a range of approximately 10 Å to 30 Å. When the thickness of the first work function layer 323 is smaller than 10 Å, the first work function layer 323 may not be able to effectively adjust the work function of the work function layer in the second region B. When the thickness of the first work function layer 323 is larger than 30 Å, the threshold voltage of the semiconductor device formed subsequently may be overly adjusted due to the excessively large thickness of the first work function layer 323, which may be adverse to the desired performance of the semiconductor device.

In one embodiment, the semiconductor device may also include a cover layer (not shown) formed on the surface of the portion of the gate dielectric layer 322 on the sidewall and the top surfaces of the openings 310.

The cover layer may be able to prevent the gate dielectric layer 322 from being exposed into the process gas during the subsequently performed annealing process. Moreover, the cover layer may provide protection for the gate dielectric layer 322 during the process for forming the first work function layer, and, together with the subsequently-formed work function layer, may adjust the threshold voltage of the transistors.

In one embodiment, the cover layer may be made of a material including TiN or TaN. In other embodiments, the semiconductor device may not include any cover layer formed on the surface of the portion of the gate dielectric layer 322 on the sidewall and the top surfaces of the openings 310.

The semiconductor device may further include a second work function layer 324 formed on the gate dielectric layer 322 in the first region A and on the first work function layer 323 in the second region B.

The second work function layer 324 may be used to protect the gate dielectric layer 322. The second work function layer 324 may prevent the material of subsequently-formed gate electrodes from diffusing into the gate dielectric layer 322, and thus ensure that the dielectric constant of the gate dielectric layer 322 cannot be easily changed. As such, the threshold voltage of the formed transistors may not be easily shifted.

In some embodiments, the semiconductor device may be an N-type device formed on the plurality of fin structures 310, and accordingly, the second work function layer 324 may be made of an N-type work function material. The N-type work function material may include TiN or TaN.

In other embodiments, the semiconductor device may be a P-type device formed on the plurality of fin structures 310, and accordingly, the second work function layer may be made of a P-type work function material. The P-type work function material may include TaC, Ti, Al, or TiAl.

In one embodiment, the second work function layer 324 is made of an N-type work function material, and the N-type work function material layer includes TiN or TaN. For example, the second work function layer 324 is made of TiN.

Therefore, for each fin structure 310 formed in the first region A, the second work function layer 324 formed on the fin structure 310 in the corresponding opening 302 of the first region A may form a first work-function adjustment layer on the fin structure 310; for each fin structure 310 formed in the second region B, the first work function layer 323 formed on the fin structure 310 in the corresponding opening 302 of the second region B and the second work function layer 324 formed on the surface of the first work function layer 323 may form a second work function adjustment layer on the fin structure 310. That is, the first work-function adjustment layer formed on the fin structure 310 in an opening 302 of the first region A may include the second work function layer 324; the second work function adjustment layer formed on the fin structure 310 in an opening 302 of the second region B may include the first work function layer 323 formed on the fin structure 310 and the second work function layer 324 formed on the surface of the first work function layer 323.

In one embodiment, the semiconductor device may further include a gate electrode layer 325 formed on the second work function layer 324. The top surface of the gate electrode layer 325 may be leveled with the top surface of the dielectric layer 330.

The gate dielectric layer 322, the second work function layer 324, and the gate electrode layer 325 may together form a gate structure on each fin structure 310 of the first region A, and the gate dielectric layer 322, the first work function layer 323, the second work function layer 324, and the gate electrode layer 325 may together form a gate structure on each fin structure 310 of the second region B. In one embodiment, the semiconductor device may further include a source/drain doped layer (not shown) formed in the fin structures 310 on the both sides of each gate structure.

Compared to conventional semiconductor devices and fabrication methods, the disclosed semiconductor devices and fabrication methods may demonstrate the following advantages.

According to the disclosed fabrication methods, the base substrate includes a first region and a second region. The first region is located on each side of the second region, that is, the second region is located in a center region of the base substrate. The plurality of fin structures in the first region and the second region are used to form transistors that are in a same type. The concentration of the doping ions in the first doped region is lower than the concentration of the doping ions in the second doped region such that the threshold voltage of the transistors in the first region is lower than the threshold voltage of the transistors in the second region. The turn-on voltage of the channels in the transistors formed in the second region is large, and the current in the channels is small, and thus the heat generated in the fin structures of the second region is limited so that the temperature of the fin structures 210 in the center may be low. That is, heat accumulation may be less likely take place in the center region. Therefore, self-heating effect may not be severe, and thus the performance of the semiconductor device may be improved.

According to the disclosed fabrication methods, the base substrate includes a first region and a second region. The first region is located on each side of the second region, that is, the second region is located in the center region of the base substrate. The work function value of the first work-function adjustment layer in the gate structures formed across the fin structures of the first region and the work function value of the second work-function adjustment layer in the gate structures formed across the fin structures of the second region may be controlled to ensure a large threshold voltage of the channel region in the fin structures of the center region (i.e., the second region). Therefore, the current in the channels in the fin structures of the center region (i.e., the second region) is reduced, and thus the heat generated in the fin structures of the second region is limited so that heat accumulation may be less likely take place in the center region. As such, self-heating effect may not be severe, and the performance of the semiconductor device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
providing a base substrate, including a first region, a second region, and a third region, wherein the first region is adjacent to the second region and located on each side of the second region, the third region located between the first region and the second region, a plurality of discrete fin structures is formed on the base substrate, and the plurality of discrete fin structures includes a first plurality of fins structures in the first region, and a second plurality of fin structures in the second region, and a third plurality of fin structures in the third region;
forming a first doped region in the first plurality of fin structures in the first region;
forming a second doped region in the second plurality of fin structures in the second region, wherein a concentration of doping ions in the first doped region is lower than a concentration of doping ions in the second doped region, and the doping ions in the first doped region have a same doping type as the doping ions in the second doped region;
forming a third doped region in the third plurality of fin structures in the third region; and
after forming the first doped region and the second doped region, forming a plurality of gate structures on the first doped region and the second doped region across the plurality of discrete fin structures.

2. The method according to claim 1, wherein:
forming the first doped region includes an ion implantation process or a solid state source doping process.

3. The method according to claim 1, wherein:
forming the second doped region includes an ion implantation process or a solid state source doping process.

4. The method according to claim 1, wherein the first doped region and the second doped region are both formed by ion implantation processes, and forming the first doped region and the second doped region includes:
forming a mask layer on the base substrate, wherein the mask layer defines positions and shapes of the plurality of discrete fin structures in the first region and the second region;
performing a first ion implantation process on the plurality of discrete fin structures in the first region and the second region using the mask layer as a mask;
after performing the first ion implantation process, performing a second ion implantation process on the plurality of discrete fin structures in the first region and the second region using the mask layer as a mask to form the first doped region and the second doped region, wherein an implantation direction of the first ion implantation process and an implantation direction of the second ion implantation process are symmetrical along a normal direction of the base substrate, and the implantation direction of the first ion implantation process and the implantation direction of the second ion implantation process are perpendicular to an extending direction of the plurality of discrete fin structures.

5. The method according to claim 4, wherein:
a distance from the mask layer to a fin structure at an edge of the first region is in a range of approximately 30 nm to 300 nm.

6. The method according to claim 4, wherein:
a vertical distance from a top surface of the mask layer to a top surface of the plurality of discrete fin structures is N times of a height of the plurality of discrete fin structures, where N is an integer greater than or equal to 1 and represents a number of fin structures in the first region on one side of the second region.

7. The method according to claim 6, wherein the plurality of discrete fin structures is used to form a P-type device, and parameters used in the first ion implantation process or the second ion implantation process include:
implantation ions including phosphor ions or arsenic ions;
an implantation energy in a range of approximately 10 keV to 30 keV;
an implantation dose in a range of approximately 1E13 atom/cm$^2$ to 5E14 atom/cm$^2$; and
a tilt angle in a range of approximately 10° to 40°.

8. The method according to claim 6, wherein the plurality of discrete fin structures is used to form an N-type device, and parameters used in the first ion implantation process or the second ion implantation process include:
implantation ions including boron ions or BF$^{2-}$ ions;
an implantation energy in a range of approximately 10 keV to 30 keV;
an implantation dose in a range of approximately 1E13 atom/cm$^2$ to 5E14 atom/cm$^2$; and
a tilt angle in a range of approximately 10° to 40°.

9. The method according to claim 1, wherein the first doped region and the second doped region are both formed by solid state source doping processes, and forming the first doped region and the second doped region includes:
forming the first doped region containing first doping ions with a first concentration on a surface of the first plurality of fin structures in the first region of the base substrate;
forming the second doped region containing second doping ions with a second concentration on a surface of the second plurality of fin structures in the second region of the base substrate, wherein:
the first doping ions and the second doping ions have a same doping type, and
the second concentration is larger than the first concentration; and
after forming the first doped layer and the second doped layer, performing an annealing process on the first doped layer and the second doped layer to allow the first doping ions to enter the first plurality of fin structures in the first region and the second doping ions to enter the second plurality of fin structures in the second region.

10. The method according to claim 9, wherein:
the plurality of discrete fin structures is used to form a P-type device;
the first doped layer is made of a material including silicon or SiGe;
the first doping ions are P-type ions, including phosphor ions or arsenic ions;
the second doped layer is made of a material including silicon or SiGe; and
the second doping ions are P-type ions, including phosphor ions or arsenic ions.

11. The method according to claim 9, wherein:
the plurality of discrete fin structures is used to form an N-type device;
the first doped layer is made of a material including silicon oxide or silicon nitride;
the first doping ions are N-type ions, including boron ions, BF$^{2-}$ ions, or indium ions;
the second doped layer is made of a material including silicon oxide or silicon nitride; and
the second doping ions are N-type ions, including boron ions, BF$^{2-}$ ions, or indium ions.

12. A semiconductor device formed by the method according to claim 1.

13. A method for fabricating a semiconductor device, comprising:
providing a base substrate, including a first region and a second region, wherein the first region is adjacent to the second region and located on each side of the second region, a plurality of discrete fin structures is formed on the base substrate, and the plurality of discrete fin structures includes a first plurality of fins structures in the first region and a second plurality of fin structures in the second region;
forming a first doped region in the first plurality of fin structures in the first region;
forming a second doped region in the second plurality of fin structures in the second region, wherein a concentration of doping ions in the first doped region is lower than a concentration of doping ions in the second doped region, and the doping ions in the first doped region have a same doping type as the doping ions in the second doped region; and
after forming the first doped region and the second doped region, forming a plurality of gate structures on the first doped region and the second doped region across the plurality of discrete fin structures, wherein the base substrate further includes a third region adjacent to the first region and the second region, located between the first region and the second region, and containing a third plurality of fin structures, the method further includes:
forming a third doped region in the third plurality of fin structures in the third region, wherein
a concentration of doping ions in the third doped region is larger than the concentration of the doping ions in the first doped region;
the concentration of doping ions in the third doped region is smaller than the concentration of the doping ions in the second doped region; and
the doping ions in the third doped region have a same doping type as the doping ions in the first doped region and the doping ions in the second doped region.

14. A method for fabricating a semiconductor device, comprising:
providing a base substrate, including a first region and a second region, wherein the first region is adjacent to the second region and located on each side of the second region, a plurality of discrete fin structures is formed on the base substrate in the first region and the second region, and the plurality of discrete fin structures includes a first plurality of fins structures in the first region and a second plurality of fin structures in the second region;
forming a dielectric layer on the base substrate, wherein the dielectric layer contains a plurality of openings exposing a portion of a surface of each fin structure of the plurality of discrete fin structures, wherein the plurality of openings includes a first plurality of openings in the first region and a second plurality of openings in the second region;

forming a gate dielectric layer on bottom surfaces of the plurality of openings;

forming a first work-function adjustment layer on a surface of the gate dielectric layer in the first plurality of openings in the first region;

before or after forming the first work-function adjustment layer, forming a second work-function adjustment layer on the surface of the gate dielectric layer in the second plurality of openings in the second region, wherein:

a work function value of the second work-function adjustment layer is different from a work function value of the first work-function adjustment layer, and the first work-function adjustment layer and the second work-function adjustment layer have a same work function type; and after forming the first work-function adjustment layer and the second work-function adjustment layer, forming a gate electrode layer in the plurality of openings, wherein the gate electrode layer fills up the plurality of openings.

15. The method according to claim 14, wherein:

when the plurality of discrete fin structures is used to form an N-type device, the first work-function adjustment layer and the second work-function adjustment layer are made of an N-type work function material; and when the plurality of discrete fin structures is used to form a P-type device, the first work-function adjustment layer and the second work-function adjustment layer are made of a P-type work function material.

16. The method according to claim 15, wherein:

a thickness of the first work-function adjustment layer is smaller than a thickness of the second work-function adjustment layer.

17. The method according to claim 15, wherein:

the N-type work function material includes TiN or TaN.

18. The method according to claim 15, wherein:

the P-type work function material includes TaC, Ti, Al, or TiAl.

19. The method according to claim 17, wherein:

a nitrogen atomic percentage concentration in the second work-function adjustment layer is larger than a nitrogen atomic percentage concentration in the first work-function adjustment layer.

20. A semiconductor device formed by the method according to claim 14.

* * * * *